(12) United States Patent
Schuler

(10) Patent No.: US 9,010,999 B2
(45) Date of Patent: Apr. 21, 2015

(54) METHOD FOR DETERMINING THE TEMPERATURE OF A POWER SEMICONDUCTOR

(75) Inventor: Stefan Schuler, Erlangen (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 443 days.

(21) Appl. No.: 13/109,730

(22) Filed: May 17, 2011

(65) Prior Publication Data

US 2012/0201272 A1 Aug. 9, 2012

(30) Foreign Application Priority Data

May 20, 2010 (DE) .......................... 10 2010 029 147

(51) Int. Cl.
*G01K 7/00* (2006.01)
*G01K 7/16* (2006.01)

(52) U.S. Cl.
CPC .............. *G01K 7/16* (2013.01); *G01K 2217/00* (2013.01); *H01L 2224/48091* (2013.01); *H01L 2924/10253* (2013.01)

(58) Field of Classification Search
USPC ................... 374/170, 178, 185, 183; 702/130
See application file for complete search history.

(56) References Cited

U.S. PATENT DOCUMENTS

| | | | | |
|---|---|---|---|---|
| 5,828,263 | A * | 10/1998 | Gantioler et al. | 327/512 |
| 5,886,515 | A * | 3/1999 | Kelly | 323/313 |
| 6,092,927 | A * | 7/2000 | Clemente | 374/163 |
| 6,137,165 | A | 10/2000 | Thierry | |
| 8,057,094 | B2 * | 11/2011 | Luniewski | 374/178 |
| 2004/0227545 | A1 * | 11/2004 | Nadd et al. | 327/78 |
| 2005/0224909 | A1 * | 10/2005 | Yamaguchi et al. | 257/528 |
| 2007/0176626 | A1 * | 8/2007 | Bayerer et al. | 324/771 |
| 2009/0129432 | A1 * | 5/2009 | Luniewski | 374/100 |
| 2009/0167414 | A1 * | 7/2009 | Jansen | 327/513 |
| 2010/0001785 | A1 * | 1/2010 | Baginski et al. | 327/513 |
| 2011/0102059 | A1 | 5/2011 | Stoisiek et al. | |
| 2014/0112372 | A1 * | 4/2014 | Hoene et al. | 374/178 |

FOREIGN PATENT DOCUMENTS

| | | | |
|---|---|---|---|
| DE | 19630902 A1 | * | 2/1998 |
| DE | 100 31 115 A1 | | 1/2001 |
| DE | 10 2008 023 216 A1 | | 12/2009 |
| DE | 10 2009 045 068 | | 3/2011 |
| WO | WO 2009/141350 A2 | | 11/2009 |

* cited by examiner

*Primary Examiner* — Mirellys Jagan
(74) *Attorney, Agent, or Firm* — The Law Offices of Roger S. Thompson

(57) ABSTRACT

A method for determining the temperature of a power semiconductor, wherein a first control contact is connected to a first pole of a series resistor integrated in the power semiconductor. A second pole—which continues to the power semiconductor—of the series resistor is connected to a second control contact. A first control contact and a second control contact are connected to a first connection terminal and second connection terminal via respective bonding wires. The resistance value of the series resistor is determined by an electrical measurement between the two connection terminals. On the basis of the resistance value and a temperature-resistance characteristic curve of the series resistor, the temperature of the power semiconductor is determined based on the temperature of the series resistor.

7 Claims, 3 Drawing Sheets

METHOD FOR DETERMINING THE TEMPERATURE OF A POWER SEMICONDUCTOR

BACKGROUND OF THE INVENTION

1. Field of the Invention

The invention relates to a method for determining the temperature of a power semiconductor.

2. Description of the Related Art

Integrated semiconductor components are produced as so-called semiconductor chips, or chips for short, in general from a base substrate, e.g., a silicon wafer. Power semiconductors, e.g., IGBTs, are also produced as chips of this type.

A power semiconductor generally has a control contact, via which the power semiconductor is driven. In the case of an IGBT, for example, this is the gate, via which a switching operation is initiated in the IGBT. Power semiconductors with an integrated series resistor are known. The series resistor is then connected in series with the control contact within the power semiconductor.

In this case, the driving is still effected via the control contact. The internal gate resistor co-ordinated with the respective power semiconductor is intended, e.g., to compensate for differently formed or pronounced Miller plateaus and to bring about more uniform switching of the power semiconductor.

A more recent generation of power semiconductors is also known which have, alongside the first control contact mentioned, a second contact, i.e., there is a usually smaller contact window or so-called auxiliary window on the chip. This auxiliary window is in direct contact with the actual internal control contact or control connection in the power semiconductor and thereby bypasses the series resistor.

In other words, the resistor integrated in the chip is situated between the two control contacts. The first pole of the resistor is therefore connected to the first control contact, and its second pole is connected to the second control contact. The internal gate resistor has, under normal conditions, for example a resistance value of approximately 10Ω. Usually, only the contact window—designated as the main window—of the first control contact is ever bonded or contact-connected on such a chip. The series resistor itself is inaccessible for contact-connection since it is situated internally in the power semiconductor.

The service life of such a power semiconductor depends largely upon the temperature stress or the temperature loading experienced by the power semiconductor in the course of its operating. For this reason, the so-called junction temperature is crucial, primarily in power semiconductor switches. It is therefore desirable to track the junction temperature of a power semiconductor as accurately as possible during the operation of the power semiconductor; e.g., a rough estimation of the expected remaining service life of the chip thus becomes possible. Replacement can then take place in a timely and planned fashion before failure of the chip is expected.

SUMMARY OF THE INVENTION

It is known to arrange a semiconductor chip on a substrate and to apply a conventional temperature sensor, e.g., in the form of an NTC (negative temperature coefficient) thermistor, as near as possible to the semiconductor chip. The sensor detects the temperature of the substrate and thus indirectly, or very approximately, the temperature of the chip and thus the junction temperature. However, temperature differences of about up to 80° C. between the actual junction temperature and measured temperature are to be expected with this method.

It is also known to apply a thermosensor, e.g., in the form of a thermoelement, on the chip itself, e.g., on the potting housing. Under this procedure, the temperature detection takes place nearer to the actual chip or the depletion layer. In this case as well, however, the junction temperature is detected only inaccurately with differences of about up to 20° C. The detection of the temperature by means of a thermoelement is known, e.g., from DE 10 2009 045 068.8.

Overall, therefore, the present temperature or junction temperature of a power semiconductor is not detected satisfactorily. Thus hitherto, there exists no sufficiently accurate device or method for determining the stress state and hence service life estimates or prognoses or the like for a power semiconductor.

It is an object of the invention to provide an improved method for determining the temperature of a power semiconductor.

The invention is based on the recognition that the integrated gate resistor lies particularly near the depletion layer and is temperature-dependent. The resistance value of the gate resistor is thus dependent on the actual internal temperature inside the chip.

The invention is based on the concept that, in the case of a power semiconductor embodied as a chip, the second control contact can also be connected via a bonding wire to provide, together with a bonding of the first control contact, direct electrical access to the internal gate resistor on both sides. Both connections of the internal resistor can therefore be made accessible by means of electrical contacts. Since the internal gate resistor is temperature-dependent, the temperature can be measured indirectly here via the gate resistor. The so-called auxiliary window on the chip, which forms the second control contact, is generally sufficient in terms of its geometry to be able to be bonded, e.g., by means of a bonding wire having a diameter of about 75 μm.

According to the invention, therefore, the first and second control contacts of the chip are connected, that is to say bonded, to a first connection terminal and a second connection terminal via a respective bonding wire. Only the connection terminals are then externally accessible by further electrical circuitry or contact-connection. According to the invention, the resistance value of the series resistor is determined by an electrical measurement between the two connection terminals. On the basis of the resistance value and a temperature-resistance characteristic curve of the series resistor, the temperature of the series resistor is determined to be the temperature of the power semiconductor.

According to the invention, electrical access to the resistor on both sides is provided via the connection wires and the connection terminals. The temperature dependence of the on-chip integrated series resistor is proportional to the reciprocal mobility of the charge carriers. The mobility decreases as the temperature rises, and so the resistance increases as the temperature rises. In order to evaluate the resistance, it is necessary to measure current and voltage at the internal gate resistor. Current and voltage can then be converted in a simple manner into an equivalent resistance value and, by way of the characteristic curve, into a temperature value.

A measurable current flow is present in the series resistor only when a switching current is fed to or removed from the first control contact; that is to say, e.g., only during the switch-on or switch-off operation of an IGBT. In a first embodiment of the invention, therefore, the measurement is effected during the operationally governed energization of the first control contact with an operating current. In other words, the operating current is used as a measurement current. In the first embodiment of the invention, therefore, the operating current is measured and, at the same time, the voltage across the series resistor is determined.

In an alternative embodiment, the measurement is carried out by means of a measurement current explicitly fed via the two control contacts. For this purpose, it is also possible, e.g., for a further resistor, generally having a higher resistance, to be connected to the second control contact, for example for a corresponding resistor to be contact-connected to the auxiliary window. By means of a small potential difference, a small auxiliary current or measurement current can then be generated at any desired point in time in the series resistor and the instantaneous resistance value can be measured here. The temperature measurement is then, e.g., not coupled to the switching operations in the IGBT.

In a further embodiment of the invention, the characteristic curve is determined on the basis of a calibration procedure at the power semiconductor. This can be effected, e.g., for each individual chip, a chip series or a chip type. By way of example, before the first start-up of a power semiconductor, an automatic calibration can take place, during which a specific characteristic curve is established. The characteristic curve can then be stored fixedly and permanently for said chip in order to be able to use the characteristic curve in the method.

In one preferred embodiment, the chip is mounted on a carrier circuit board (by, for example, DCB—Direct Copper Bonding), which additionally has a dedicated temperature sensor mentioned above. The characteristic curve can then be determined during no-load operation of the power semiconductor with the aid of the temperature sensor. Since, in the context of the calibration procedure, a temperature equilibrium between chip and temperature sensor can be ensured, or a differential temperature which is known in this case prevails here, under certain circumstances, an accurate temperature calibration can take place by means of the temperature sensor of the carrier circuit board. Since, in particular, the chip is in no-load operation, no thermal local disturbances arise such as, e.g., during the operation of the chip. That is to say if the latter produces waste heat as a result of a load current, for example, the waste heat is reflected locally only in the chip and not at the temperature sensor.

In other words: If the chip is mounted on a circuit board and if the latter has a conventional temperature sensor, e.g., the NTC mentioned above, the NTC temperature can be used as a reference during no-load operation of the chip for the actual resistor temperature.

Known chips in the form of IGBTs nowadays have a single internal gate resistor or series resistor. With regard to recent developments, however, chips having a plurality of internal series resistors are also conceivable. Alternatively, a parallel circuit formed by a plurality of IGBTs is conceivable; an arrangement having a plurality of internal series resistors may also be formed in this way. In these and other comparable situations, a structure arises having a plurality of series resistors which are thermally coupled among one another and each individual one of which can be used for the temperature measurement according to the invention.

In one advantageous embodiment, one or more of the power semiconductors or chips just mentioned has/have a plurality of series resistors with two respective control contacts. The method is then carried out at that one of the series resistors which is known to offer the best initial position for the desired measurement: by way of example, for determining service life, that series resistor is chosen which is known to be subjected to the most thermal stress as a result of its positioning. In other words, therefore, for a chip having a plurality of series resistors, only the series resistor subjected to the most thermal loading is evaluated to determine the maximum temperature loading of the chip. Thus, e.g., a "worst case" evaluation of the temperature with regard to service life estimation, etc., becomes possible.

In an alternative embodiment, wherein the power semiconductor as just explained likewise has at least some series resistors with respective control contacts, the method is carried out on at least some of the series resistors. By way of example, by means of a series circuit formed by a plurality or all of the series resistors, an average temperature of all the corresponding measurement locations could be determined. Alternatively, by way of example, it is also possible for a respective individual measurement to take place and for a subsequent selection or averaging of different determined temperatures of individual series resistors to take place.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

For a further description of the invention, reference is made to the exemplary embodiments in the drawings, in which, in each case in a schematic basic diagram.

DETAILED DESCRIPTION OF THE PRESENTLY PREFERRED EMBODIMENTS

Figure 1:
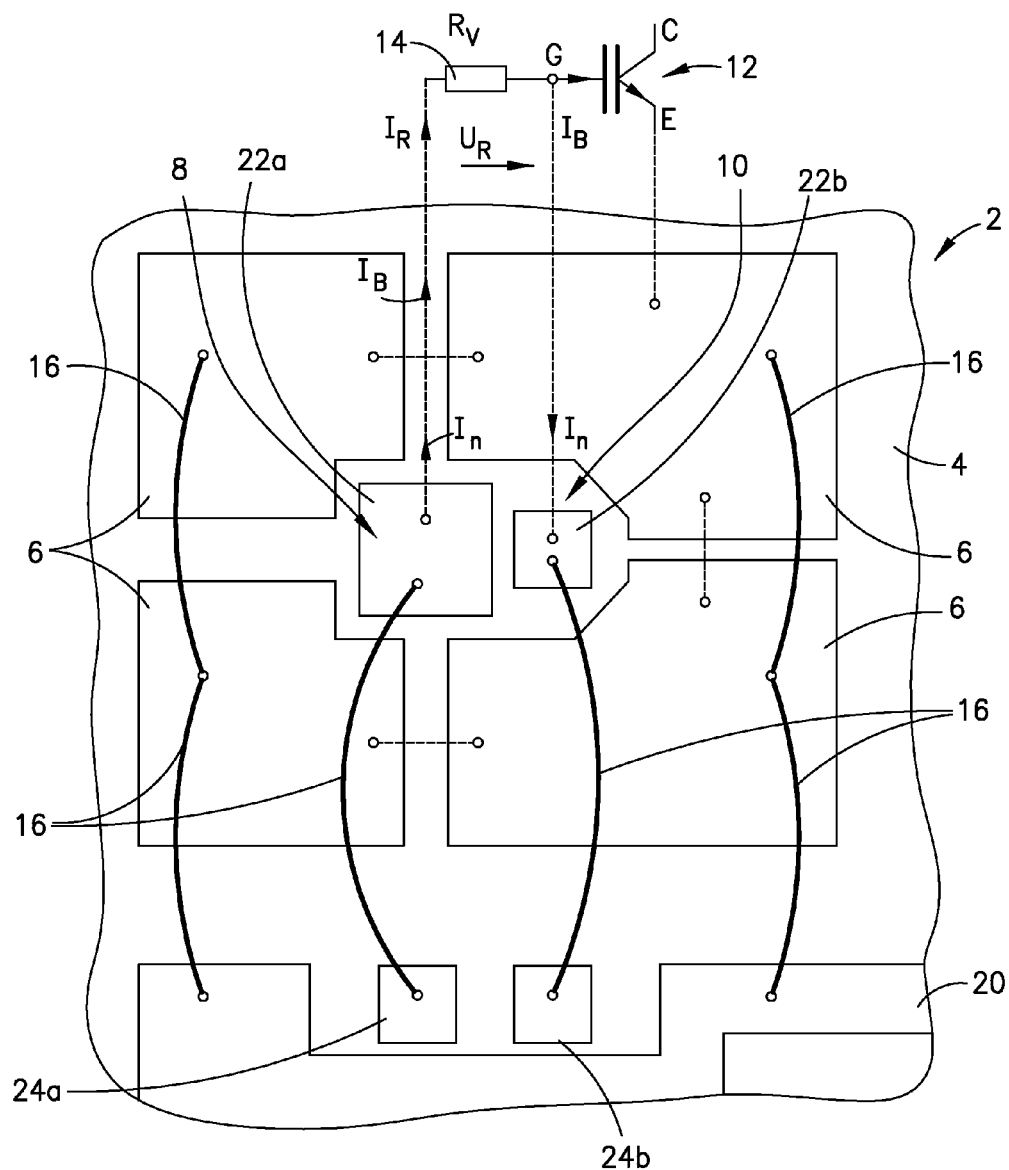
FIG. 1 shows a power semiconductor embodied as a chip, in plan view.

FIG. 1 shows a power semiconductor in the form of an IGBT, which is embodied in integrated fashion as a chip 2. FIG. 1 shows chip 2 in plan view, i.e., an excerpt from the top side 4 of chip 2. On top side 4, windows to be contact-connected in the form of metallization surfaces arranged on the processed silicon substrate can be seen, namely four emitter windows 6, one gate window 8 and one auxiliary window 10.

The on-chip circuitry is indicated by dashed lines in FIG. 1: a power semiconductor 12, that is to say the IGBT as an integrated semiconductor structure, is connected in parallel by its emitter E with the four emitter windows 6. Collector C leads to the chip underside (not visible in FIG. 1) in the form of a whole-area metallization as collector connection 11 (see FIG. 3). Gate G of power semiconductor 12 is directly contact-connected to the auxiliary window 10. Gate G is connected to gate window 8 via an on-chip series resistor 14 having the resistance value $R_V$.

Chip 2 per se cannot be directly contact-connected, e.g., soldered. For this purpose, so-called bonding firstly has to take place: for the purpose of contact-connecting power semiconductor 12, emitter windows 6 are connected to an emitter connection terminal 20 with the aid of bonding wires 16.

Collector C can be soldered directly via collector connection 11. By way of example, the chip underside is soldered in a planar fashion. Gate window 8 as first control contact 22a of chip 2 is likewise connected to a first gate connection terminal 24a via a bonding wire 16. The circuitry interconnection or electrical driving of power semiconductor 12 during operation is thus effected via collector connection 11 and also connection terminals 20 and 24a. Auxiliary window 10 is not used in accordance with the prior art.

According to the invention, auxiliary window 10 as second control contact 22b is connected to a second gate connection terminal 24b. According to the invention, the voltage $U_R$ drop across series resistor 14 and the current $I_R$ flowing through the latter are measured at connection terminals 24a, b. Value $R_V$ of series resistor 14 can be determined from these two variables.

Figure 2:
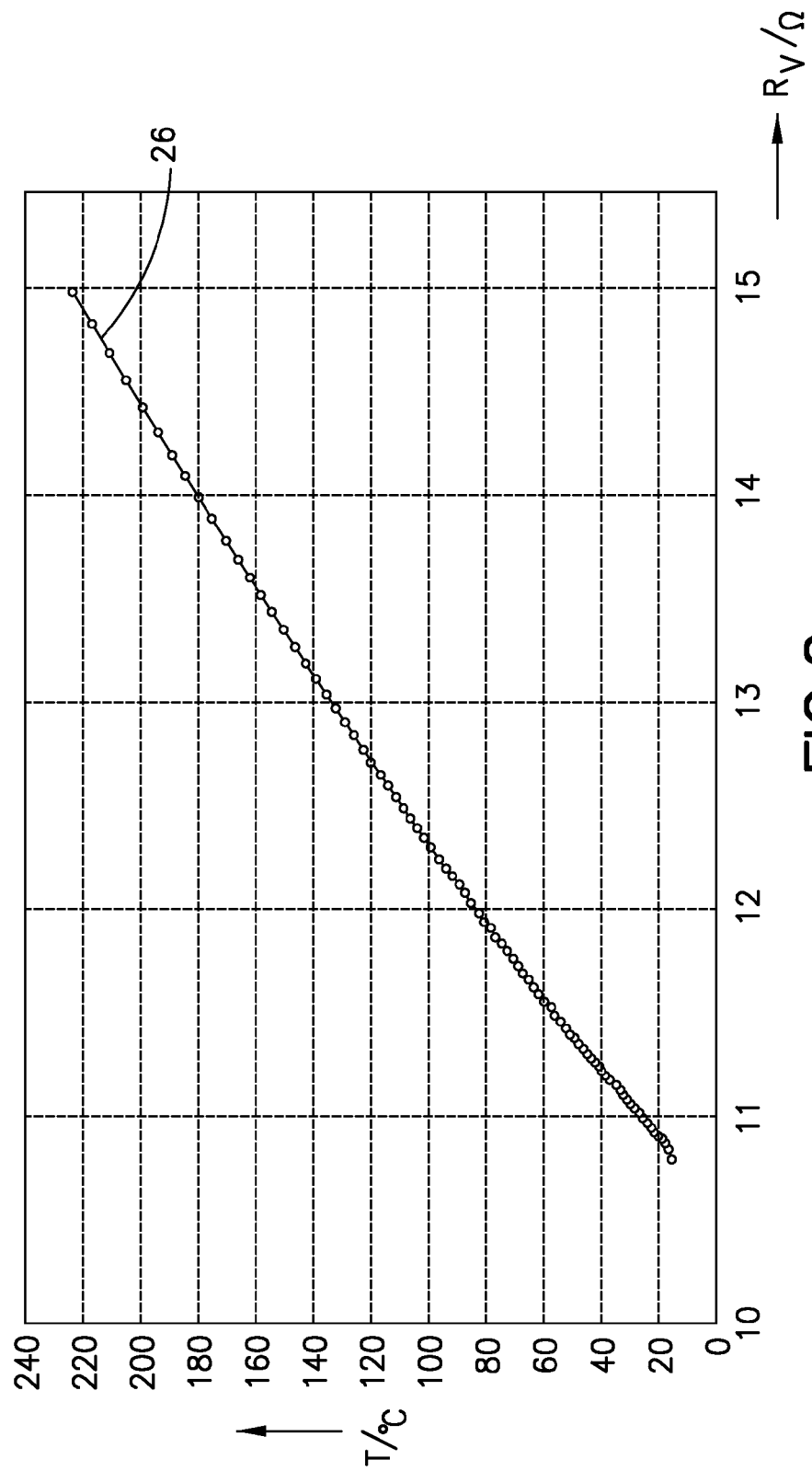
FIG. 2 shows the resistance-temperature characteristic curve of the power semiconductor from FIG. 1.

FIG. 2 shows a characteristic curve 26 which is applicable to series resistor 14 and which reproduces the relationship thereof between resistance value $R_V$, expressed in ohms, and the temperature, expressed in ° C. of series resistor 14. In this case, the temperature of series resistor 14 can be equated with the temperature of chip 2 or of power semiconductor 12, particularly in the case of an IGBT with the junction temperature thereof, since series resistor 14 is likewise situated in an integrated fashion in the same semiconductor substrate and, consequently, it is possible to assume that these respective components of chip 2 are at the same temperature. According to the invention, therefore, the temperature of power semiconductor 12 is determined by means of the characteristic curve 26 resistance value $R_V$ determined from the voltage $U_R$ and the current $I_R$.

In a first embodiment, in this case, the current $I_R$ is that operating current $I_B$ which flows during a switching operation at power semiconductor 12. Current $I_R$ thus flows exclusively via the connection terminal 24a into series resistor 14 and from there into gate G of power semiconductor 12. At the connection terminal 24b, no current flow is measured, rather only voltage $U_R$ without a current (apart from a possible minimal measuring device current).

In an alternative embodiment, by contrast, no current flows into gate G of power semiconductor 12 since the latter is not presently in a switching operation. As an alternative embodiment, an electric circuit is then formed via connection terminal 24a, series resistor 14 and connection terminal 24b, the current $I_R$ flowing through said electric circuit. In contrast to the switching current mentioned above, $I_R$ is then a pure measurement current $I_M$. In this case, the voltage $U_R$ is determined in the same way between the connection terminals 24a, b.

In a further embodiment, characteristic curve 26 is determined beforehand in a calibration procedure, wherein chip 2 is heated to specific temperatures in a thermal cabinet, for example, the temperature T being known, e.g., on account of a measurement in the thermal cabinet, and then resistance value $R_V$ is determined with respect to known temperature T.

Figure 3:
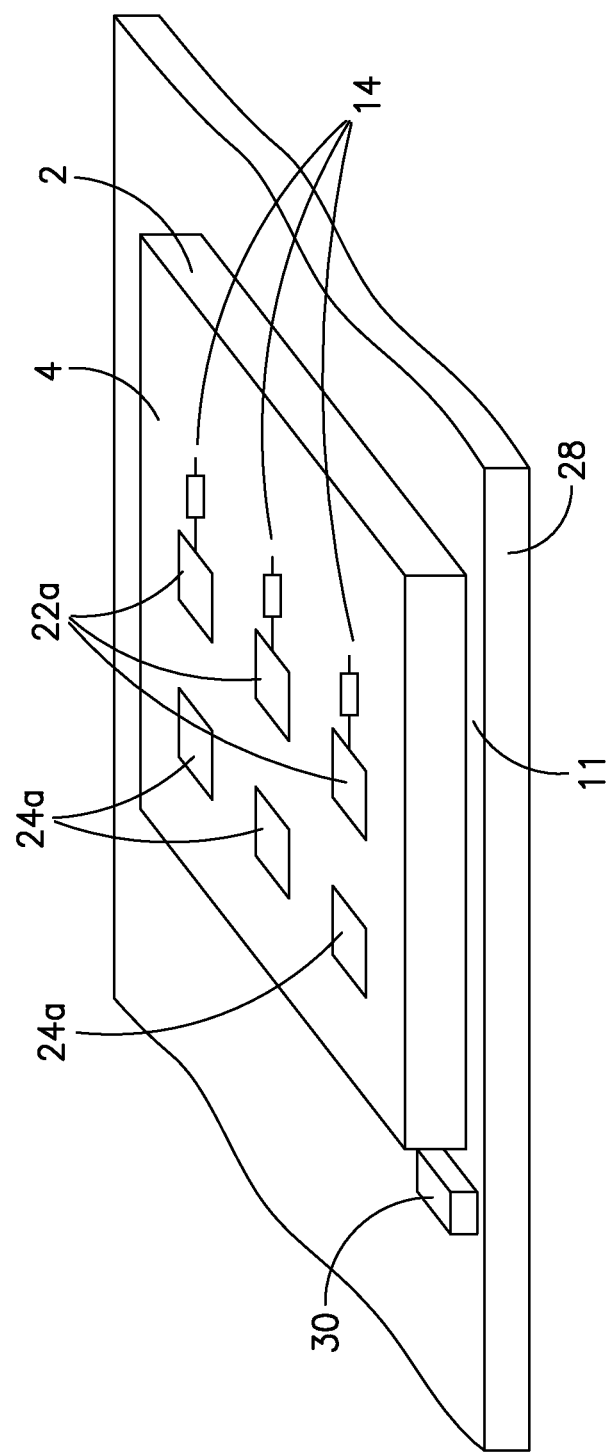
FIG. 3 shows an alternative power semiconductor in a perspective illustration.

FIG. 3 shows an alternative embodiment, wherein chip 2 is mounted on a carrier circuit board 28 by virtue of collector connection 11 of chip 2 being soldered to said carrier circuit board. A temperature sensor 30 is additionally mounted on carrier circuit board 28 directly alongside chip 2. Characteristic curve 26 is then alternatively determined in such a way that the entire arrangement composed of carrier circuit board 28 and chip 2 is heated, the temperature being determined in each case by temperature sensor 30. The associated resistance $R_V$ is then determined again by means of the above-described measurement of voltage $U_R$ and current $I_R$. This measurement takes place, in particular, during no-load operation of power semiconductor 12, that is to say when collector C and emitter E thereof are not energized and are free of voltage. This ensures that no additionally generated waste heat arises internally in chip 2 and the temperature measurement of temperature sensor 30 yields accurate results.

FIG. 3 additionally shows an embodiment of a chip 2 or a power semiconductor 12 which internally has a plurality of series resistors 14 and, in an accessible fashion, a plurality of control contacts 22a, b (in part not illustrated) respectively connected thereto, and also connection terminals 24a, b (in part not illustrated). In a first embodiment, the method described above is carried out only on that series resistor from among series resistors 14 shown which is subjected to the most thermal stress.

In an alternative embodiment of the method, the latter is carried out on some or all of series resistors 14, a respective selection or communication of the possibly different temperatures taking place in order to determine the respective temperature of power semiconductor 12 as accurately as possible.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed:

1. A method for determining the temperature of a power semiconductor having an internal control contact, wherein a first control contact is connected to a first pole of a series resistor, the first pole of the series resister being integrated in the power semiconductor, a second pole of the series resistor being connected to a second control contact and also to the internal control contact, wherein the method comprises the steps of:
   connecting the first control contact and second control contact to a first connection terminal and second connection terminal via respective bonding wires; and
   determining a resistance value of the series resistor by an electrical measurement between the first and second connection terminals,
   whereby the temperature of the power semiconductor is determined as the temperature of the series resistor, based on the determined resistance value and a predetermined temperature-resistance characteristic curve of the series resistor.

2. The method of claim 1, wherein the electrical measurement is effected during an operationally governed energization of the first control contact with an operating current.

3. The method of claim 1, wherein the electrical measurement is effected with the aid of a measurement current fed via the first and second control contacts.

4. The method of claim 1, wherein the characteristic curve is determined on the basis of a calibration procedure at the power semiconductor.

5. The method of claim 1,
wherein the power semiconductor is mounted on a carrier circuit board with an integrated temperature sensor; and
wherein the characteristic curve is determined during no-load operation of the power semiconductor with the aid of the temperature sensor.

6. The method of claim 1,
wherein the power semiconductor has a plurality of series resistors with respective control contacts; and
wherein the method is carried out on a series resistor from among said plurality of series resistors which is subjected to the most thermal stress.

7. The method of claim 1,
wherein the power semiconductor having a plurality of series resistors with respective control contacts, and
wherein the method is carried out on a plurality of the series resistors.

\* \* \* \* \*